US006378094B1

United States Patent
Chakraborty et al.

(10) Patent No.: US 6,378,094 B1
(45) Date of Patent: Apr. 23, 2002

(54) METHOD AND SYSTEM FOR TESTING CLUSTER CIRCUITS IN A BOUNDARY SCAN ENVIRONMENT

(75) Inventors: Tapan Jyoti Chakraborty, West Windsor; Bradford Gene Van Treuren, Lambertville, both of NJ (US)

(73) Assignee: Lucent Technologies Inc., Murrray Hill, NJ (US)

( * ) Notice: Subject to any disclaimer, the term of this patent is extended or adjusted under 35 U.S.C. 154(b) by 0 days.

(21) Appl. No.: 09/283,421

(22) Filed: Apr. 1, 1999

(51) Int. Cl.[7] .............................................. G01R 31/28
(52) U.S. Cl. ........................ 714/727; 714/30; 714/733; 714/735; 714/736
(58) Field of Search ............................ 714/30, 39, 724, 714/732, 733, 727, 738, 734, 735, 736, 737

(56) References Cited

U.S. PATENT DOCUMENTS

| | | | | |
|---|---|---|---|---|
| 5,260,946 A | * | 11/1993 | Nunally | 714/724 |
| 5,444,716 A | * | 8/1995 | Jarwala et al. | 714/727 |
| 5,513,188 A | * | 4/1996 | Parker et al. | 714/727 |
| 5,570,375 A | * | 10/1996 | Tsai et al. | 714/727 |

* cited by examiner

Primary Examiner—Emmanuel L. Moise

(57) ABSTRACT

A method and system for testing circuit clusters in a boundary scan environment identifies the circuit clusters and corresponding neighboring boundary scan elements, and generates one or more test vectors to be applied to the cluster under test. The generated test vectors are serialized and input into an identified boundary scan element connected to the cluster being tested in the form of a boundary scan test chain. The output of the applied test vectors is observed from an output of another correspondingly identified boundary scan element connected to the cluster under test. During generation of test vectors a list of faults for detecting by each generated vector is maintained such that the observed output can be used to diagnose faults at the component level within the identified cluster.

12 Claims, 2 Drawing Sheets

METHOD AND SYSTEM FOR TESTING CLUSTER CIRCUITS IN A BOUNDARY SCAN ENVIRONMENT

BACKGROUND OF THE INVENTION

1. Field of the Invention

The present invention relates to testing electronic printed circuit or wiring boards and, more particularly, to a system and method for testing digital clusters on a circuit board in a boundary scan environment.

2. Description of the Related Art

The testing of individual circuit boards in a system made up of one or more circuit boards is becoming more and more difficult due at least in part to the shrinking of the area between the components on the boards, and to the increasing complexity of the components and the interconnections between them on the board. The reduction in size of components allows more components to fit onto each board, and thereby enables additional processing of information in less physical space than previously required.

With this shrinking technology, manual testing using an automatically controlled probe is becoming more difficult. In some cases, the probe is not small enough to physically contact the interconnections between the miniaturized circuit components. In an effort to implement testing of these components, newer components with built in testing circuitry are being designed. These components are generally referred to as boundary scan components.

Boundary scan circuit components are designed to include additional circuitry to aid in the testing of the component and its interconnection with other components. The boundary scan circuitry typically includes a test data in (TDI) pin and a test data out (TDO) pin having corresponding registers associated with each. In addition, controller circuitry added to each boundary scan circuit component includes a test access port (TAP) that enables the boundary scan testing of the respective element. IEEE standard 1149.1 governs the design, registers, protocols and testing of boundary scan elements.

A group of boundary scan elements are serially connected to each other via their respective TDI and TDO pins. For example, if chip A and chip B are the boundary scan components to be tested, the TDO pin of chip A is connected to the TDI pin of chip B. During testing, a serial test vector can be applied to the TDI pin of chip A and the output at the TDO pin of chip B monitored to determine whether the two chips are operating according to a predetermined design.

Unfortunately, circuit boards in present systems are not formed in their entirety of boundary scan components. That is, circuit boards typically consist of a combination of boundary scan components and non boundary scan elements; the latter are commonly referred to as cluster components. A circuit board may have one or more groups of cluster components which are often referred to as clusters. The combination of boundary scan and cluster components presents a problem in testing the circuit board at the component level.

One known approach to testing circuit boards having both boundary scan and non boundary scan elements is referred to as functional testing. Functional testing applies functional vectors to the input of the circuit, and then evaluates the circuit function resulting from the application of these test vectors. Since exhaustive functional testing is very expensive to implement, generally incomplete functional testing is performed to provide cost efficient manufacturing. This incomplete functional testing results in a very low quality structural test and does not provide sufficient detail about which components are not operating properly, or which interconnection between components is faulty. Thus, functional testing does not enable testing of the individual cluster circuit components and the interconnections between them and with the boundary scan components. In the event that a circuit fails the functional test, no diagnosis can readily be performed to identify the faulty component or interconnection.

The functional test vectors are provided to the system by the designers, and cannot be generated automatically. Furthermore, since functional testing does not require the identification of cluster components, a faulty component or interconnection between cluster components cannot be diagnosed for repair.

SUMMARY OF THE INVENTION

The present invention overcomes the shortfalls of functional testing used for structural testing by providing a system and method for testing circuit clusters in a boundary scan environment that enables the diagnosis of individual cluster circuit components and interconnections.

In accordance with an embodiment of the present invention, the method comprises the steps of identifying clusters and boundary scan elements that make up a circuit; creating a gate level cluster netlist for each identified cluster; generating test vectors for all possible faults in the clusters; serializing the test vectors for application using standard boundary scan testing; applying the serialized test vectors to an input of the cluster via a first boundary scan IC connected thereto; and observing the response as a corresponding boundary scan chain produced at a second boundary scan IC.

The identification of clusters and boundary scan elements categorizes the clusters with respect to neighboring boundary scan elements (ICs), and provides an indication as to which boundary scan elements can be used to test the identified clusters. This permits the TDI and TDO pins of the respective input and output boundary scan elements to be used in testing the corresponding cluster, in addition to the TAP and controller information of the corresponding boundary scan elements.

The generation of the gate level cluster netlist substantially merges all of the gate level information for all chips within each identified cluster to create an integrated netlist of each cluster. The generated netlist includes information relating to the interconnection of the circuit elements within each identified cluster.

In accordance with a preferred embodiment of the invention, the test vectors are generated such that stuck-at faults, stuck-open faults, pairwise shorts, and the interconnections between cluster circuit elements can be tested. The test vectors are generated in parallel and subsequently serialized for input into the cluster under test as a boundary scan chain at the TDI of one boundary scan element.

The resulting output from the TDO pin of the corresponding boundary scan element provides the test results. The test results are logged and enable the test technician to diagnose any faults occurring in the cluster for subsequent repair or redesign.

According to a preferred embodiment, during the generation of the parallel test vectors, a fault list or report is created identifying each generated test vector and the particular fault that it is has been generated to detect. Therefore upon receiving the output of the test in the form of a boundary scan chain, the logged test results can be used in conjunction with the created fault list/report to aide in the diagnosis of the cluster circuit components and interconnections between them.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings wherein like reference numerals denote similar elements throughout the views.

DETAILED DESCRIPTION OF THE PRESENTLY PREFERRED EMBODIMENTS

Figure 1:
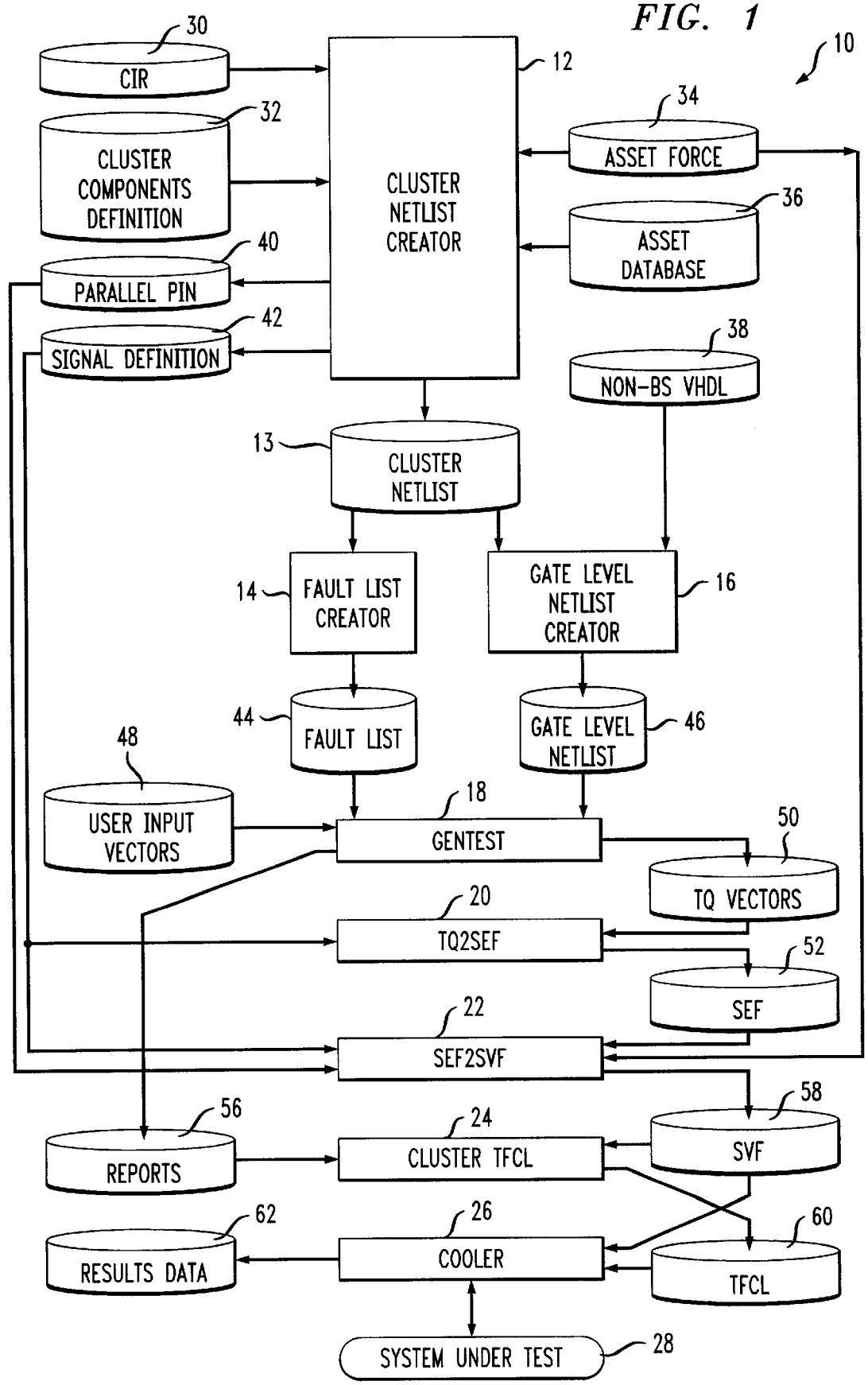
FIG. 1 is a block diagram of the functional modules used for performing generation and application of cluster tests in a boundary scan environment according to an embodiment of the present invention.
Figure 2:
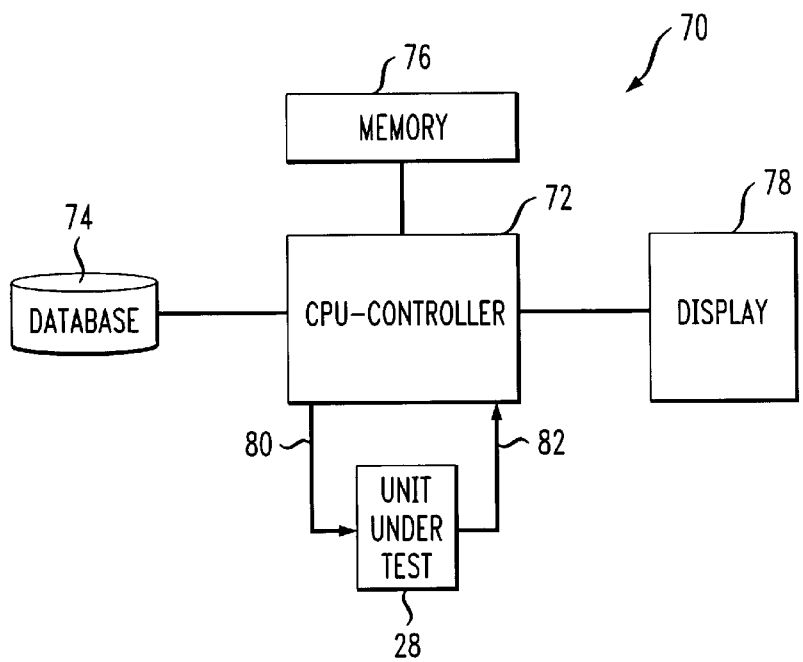
FIG. 2 is a block diagram of a system for performing cluster tests in a boundary scan environment according to an embodiment of the present invention.
Figure 3:
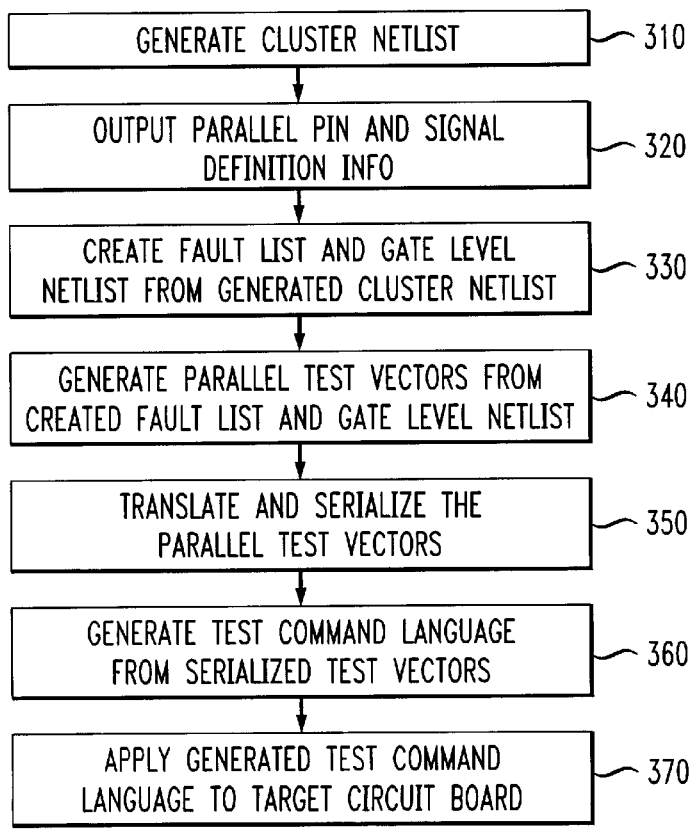
FIG. 3 is a flow chart of a method for performing generation and application of cluster tests in a boundary scan environment according to an embodiment of the present invention.

FIGS. 1 and 3 show the functional modules 10 and a method, respectively, for performing cluster tests in a boundary scan environment according to an embodiment of the present invention. Specifically, FIG. 1 shows the functional modules 10 which perform the various required tasks; FIG. 3 is a flow chart of the broad steps taken by an embodiment of the present invention. Circuit testing of this kind is generally performed in a computing environment having processors, memories, controllers, and a physical connection to the circuit board and/or particular elements on the circuit board (see FIG. 2). In FIG. 3, the first step 310 generates a cluster netlist representing the cluster portion of the circuit to be tested. In order to generate the cluster netlist, information relating to the circuit must be input into the system. For example, as shown in FIG. 1, the ASSET data base 36 supplies the Cluster Netlist Creator 12 with the complete boundary scan information relating to the board/circuits under test. The complete boundary scan information is the connectivity of every boundary scan cell and the boundary scan controller information. The ASSET force 34 is information defining which test conditions are safe and/or unsafe for this particular board. Safe test conditions are defined when using tri-state gates or a bus at the pins or internal to the circuit such that any vector applied to that bus or tri-state gate is conflict free. Thus, an unsafe condition would be when a conflict exists in the tri-state gate or bus upon application of the test vector. The CIR information 30 is the complete board netlist information which provides a list of all components (boundary scan and cluster components) and their interconnections, and the Cluster Components Definitions 32 provides the system with the respective cluster component definitions for the cluster components on the board to be tested. The cluster components definition information relates to the cluster netlist connectivity. With all of this information, the system can generate or create the cluster netlist (step 310).

Upon generation of the cluster netlist 13, the Cluster Netlist Creator 12 output parallel pin 40 and signal definition 42 information relating to the cluster (step 320 in FIG. 3). The parallel pin information 40 represents the inputs, outputs, and other types of pins on the respective identified cluster components contained within the cluster netlist, and the signal definition information 42 identifies the cluster component pins, and what kind of pins they are (e.g. I/O pins, data pins, controller pins, etc.).

The generated cluster netlist 13 is then used to create a fault list 44 and a gate level netlist 46 (step 330 in FIG. 3). The cluster netlist 13 is processed by the system and used by a Fault list creator program 14 to generate a fault list 44 which identifies the interconnections between identified cluster components (chips) and the interconnections between the cluster components and the identified surrounding boundary scan components and correspondingly connected cluster components.

The gate level netlist 46 is generated by the gate level netlist creator program 16 residing in the system, and is an integrated netlist for the identified cluster itself. The gate level netlist creator 16 utilizes Non-BS VHDL information 38 relating to the cluster circuit, flattens the hierarchical structure of the identified cluster circuit and merges all gate level information for chips within the cluster circuit such that the integrated netlist is generated for the identified cluster circuit. The Non-BS VHDL is the non-boundary scan circuit description of a cluster in VHSIC (Very High Speed Integrated Circuit) hardware definition language. In step 340 on FIG. 3, the generated fault netlist 44 and gate level netlist 46 are used to generate the test vectors for the identified cluster circuit.

Returning to FIG. 1, the Gentest 18 procedure is executed to generate the test vectors to be applied to the cluster circuit under test (thus performing step 340 in FIG. 3). Gentest 18 is an automatic test procedure generation (ATPG) program that generates parallel test vectors for testing various faults within the cluster circuit. Some examples of the faults to be tested are stuck at, stuck open, shorts, or specific interconnects between cluster circuit components. Gentest 18 receives the generated fault list 44, the gate level netlist 46, and can also receive user input vectors 48 to generate test vectors for the cluster circuit under test. The user input vectors 48 can be part of a functional test or some other manually developed test vectors by test designers to test certain defective conditions within the circuit. The gentest 18 procedure is executed within a processor, and results in a plurality of parallel test vectors 50 (in TQUOTE vector format) that test various fault conditions to be applied to the identified cluster circuit. In addition to generating the test vectors (TQ vectors) 50 in step 340 of FIG. 3, gentest 18 also generates reports 56 that represent a detailed list of each generated test vector and the corresponding fault being tested by the respective test vector.

The parallel test vectors generated by gentest 18 cannot be directly applied to the identified cluster circuit and must therefore be processed further. Specifically, in step 350 of FIG. 3, the parallel test vectors (TQ vectors) 50 must be serialized such that they can be input to the boundary scan element connected to the cluster circuit in the form of a boundary scan chain to enable testing of the cluster circuit. Returning to FIG. 1, the serialization of the test vectors is performed by a serializing program 22 (SEF2SVF). Any program capable of converting parallel vector information into corresponding serial vector information can be used for this step. In order to serialize the test vector information, the test vectors 50 in the TQ vector format are translated into an SEF vector format for serialization. The TQ2SEF program 20 utilizes information relating to the signal definition 42 and the test vectors 50. The output of the TQ2SEF translating program 20 provides the test vectors 50 in SEF format 52 to the serialization program SEF2SVF 22.

The serialization program 22 uses the parallel pin 40, signal definition 42, and ASSET force 34 information in conjunction with the test vectors in SEF format 52 to generate a serial chain of test vectors. The generated serial chain of test vectors is comparable to a boundary scan test chain that is input into the test input (TDI) of an identified boundary scan element connected to the circuit cluster. The ASSET force information prevents the generation of unsafe test vectors from being applied to the circuit.

Continuing on FIG. 3, once step 350 (the serialization) is complete or, alternatively, while the serialized test vectors are being generated, they can be input into the cluster TFCL program 24 which performs step 360, the generation of a test command language (TFCL) 60 that is used to apply the test to the target circuit board in step 370. Returning to FIG. 1, the TFCL 60 is applied to the target circuit board (i.e., an identified cluster on the circuit board) using a program denoted "cooler" 26. "Cooler" is the name designated by the inventors for the software module which is a test application device driver. One of ordinary skill in the art will recognize that other test application device drivers of any suitable type may be implemented at this step without departing from the scope of this disclosure. This application of the TCFL takes the test vectors in serialized vector format (SVF) and applies them using the TFCL to the identified cluster circuit on the target circuit board or system under test 28.

FIG. 2 presents a block diagram of a system 70 for performing cluster testing in a boundary scan environment according to an embodiment of the present invention. The system or unit under test 28 is connected to CPU/controller 72 to allow the application of the generated test vectors to the identified corresponding boundary scan elements.

Memory 76 can be one large memory, or may be implemented using several memory devices accessible by CPU/controller 72. Memory 76 can be in the form of a RAM (random access memory) or ROM (read only memory) or a combination of both. All software programs used in the present invention are stored in memory 76 and are accessed by CPU/controller 72 as and when necessary.

The generation of the cluster netlist (step 310 of FIG. 3) is performed by the CPU/controller 72 with the ASSET database 36, ASSET force 34, CIR 30 and cluster components definition information 32 being permanently or temporarily stored in database 74 and/or memory 76. The generated cluster netlist 13 can then be stored in memory 76, and accessed by the fault list creator 14 and gate level netlist creator 16 programs that are subsequently executed by CPU/controller 72. The resulting fault list 44 and gate level netlist 46 can also be stored in memory 76 for retrieval upon performance of the Gentest 18 ATPG. The execution of Gentest 18 is performed by CPU/controller 72 to generate the parallel test vectors for application to the system or unit under test 28. The reports 56 identifying which generated test vectors test or detect which faults are stored in memory 76 for use in diagnosing the results of the applied test vectors to the system under test 28. The translation (TQ2SEF) 20 and serialization of the parallel test vectors (SEF2SVF) at step 22 are also performed by the CPU/controller 72.

The generation of the TFCL 60 (i.e. the cluster test command language) performed by the cluster TFCL 24 software is then applied to the system under test 28 by the CPU/controller 72. The output results data 62 (FIG. 1) provides the test operator with the system's findings with respect to the various faults tested for. The results data 62 may be displayed on display 78 and/or printed on a printer (not shown) or other output device. The results data 62 provides the operator with the ability to diagnose and troubleshoot cluster circuit components and the interconnections between and among those components.

As shown in FIG. 2, the unit or system under test 28 receives a single input 80 provided by CPU/controller 72 and has a single output 82 provided to CPU/controller 72. Input 80 and output 82 are system identified respective boundary scan input(s) and output(s) of the detected neighboring boundary scan elements connected to the identified cluster. Thus, the application of test vectors in the serialized boundary scan chain format takes place via input 80, and the output is read and analyzed by CPU/controller 72 via output 82.

While there has been shown and described and pointed out fundamental novel features of the invention as applied to preferred embodiments thereof, it will be understood that various omissions and substitutions and changes in the form and details of the methods described and devices illustrated, and in their practice and operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A method for testing cluster circuits in a boundary scan environment to detect faults in a circuit to be tested, comprising the steps of:

identifying clusters and boundary scan elements of the circuit to be tested;

generating test vectors for testing faults in the identified clusters;

generating a report identifying each of the generated test vectors and a particular fault which each generated test vector is designed to detect;

applying the generated test vectors to an input of the identified clusters as a boundary scan chain via a first identified boundary scan element connected to the identified clusters; and observing an output response of the applied test vectors at an output of a second identified boundary scan element connected to the identified clusters, said output response representing results of applying the generated test vectors to the identified clusters.

2. The method set forth in claim 1, wherein said step of identifying further comprises generating a cluster netlist for each identified cluster.

3. The method set forth in claim 2, further comprising the steps of:

generating a fault list representing interconnections between cluster components of the identified cluster and interconnections between the identified clusters and identified neighboring boundary scan elements; and generating a gate level netlist comprising an integrated netlist for each identified cluster for use in said step of generating test vectors.

4. The method set forth in claim 1, wherein said step of applying further comprises the steps of:

converting the generated test vectors into a serialized chain of test vectors;

translating the serialized chain of test vectors into a test command language; and applying the translated serialized chain of test vectors to a test input of the first identified boundary scan element connected to the identified clusters.

5. The method set forth in claim 1, further comprising the step of generating an output results data report listing the results observed at said output of the second identified boundary scan element.

6. The method set forth in claim 1, wherein said step of identifying further comprises providing cluster components definitions and boundary scan element information relating to the circuit to be tested.

7. A system for testing cluster circuits in a boundary scan environment to detect faults in a circuit to be tested, comprising:

means for identifying clusters and boundary scan elements of the circuit to be tested;

means for generating test vectors for testing faults in the identified clusters;

means for generating a report identifying each of the generated test vectors and a particular one or more faults that each generated test vector is designed to detect;

means for applying the generated test vectors to an input of the identified clusters as a boundary scan chain via a first identified boundary scan element connected to the identified clusters; and means for observing an output response of the applied test vectors at an output of a second identified boundary scan element connected to the identified clusters, said output response representing the results of applying the generated test vectors to the identified clusters for testing of the identified clusters and detecting faults in the circuit.

8. The system in accordance with claim 7, wherein said means for identifying further comprises means for generating a cluster netlist for each identified cluster.

9. The system in accordance with claim 8, further comprising:

means for generating a fault list representing interconnections between cluster components of the identified clusters and interconnections between the identified clusters and identified neighboring boundary scan elements; and means for generating a gate level netlist comprising an integrated netlist for each identified cluster for use in said means for generating test vectors.

10. The method set forth in claim 7, wherein said means for applying further comprises:

means for converting the generated test vectors into a serialized chain of test vectors;

means for translating the serialized chain of test vectors into a test command language; and means for applying the translated serialized chain of test vectors to a test input of the first identified boundary scan element connected to the identified clusters.

11. The method set forth in claim 7, further comprising means for generating an output results data report listing the results at said output of the second identified boundary scan element.

12. The method set forth in claim 7, wherein said means for identifying further comprises means for providing cluster components definitions and boundary scan element information relating to the circuit to be tested.

* * * * *